(12) United States Patent
Wang et al.

(10) Patent No.: US 6,670,265 B2
(45) Date of Patent: *Dec. 30, 2003

(54) LOW K DIELECTIC ETCH IN HIGH DENSITY PLASMA ETCHER

(75) Inventors: Fei Wang, San Jose, CA (US); James K. Kai, Santa Clara, CA (US); Angela T. Hui, Fremont, CA (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/326,744

(22) Filed: Jun. 4, 1999

(65) Prior Publication Data

US 2002/0151168 A1 Oct. 17, 2002

Related U.S. Application Data

(63) Continuation-in-part of application No. 08/864,868, filed on May 12, 1997, now abandoned.

(51) Int. Cl.$^7$ .......................................... H01L 21/4763

(52) U.S. Cl. ....................... 438/624; 438/634; 438/637; 438/700; 438/706; 438/714

(58) Field of Search ................................. 438/624, 637, 438/634, 700, 623, 627, 710, 714, 706; 257/758; 216/18, 39; 156/643.1

(56) References Cited

U.S. PATENT DOCUMENTS

| | | | | |
|---|---|---|---|---|
| 5,604,380 A | * | 2/1997 | Nishimura et al. | 257/758 |
| 5,625,232 A | * | 4/1997 | Numate et al. | 257/758 |
| 5,702,956 A | * | 12/1997 | Ying et al. | 438/627 |
| 5,770,099 A | * | 6/1998 | Rice et al. | 216/68 |
| 5,814,186 A | * | 9/1998 | Nguyen | 156/643.1 |
| 5,882,535 A | * | 3/1999 | Stocks et al. | 216/18 |
| 6,015,760 A | * | 1/2000 | Becker et al. | 438/714 |
| 6,278,174 B1 | * | 8/2001 | Havemann et al. | 257/637 |

\* cited by examiner

Primary Examiner—Olik Chaudhuri
Assistant Examiner—Hsien-Ming Lee
(74) Attorney, Agent, or Firm—Gerald M. Fisher; Deborah W. Wenocur

(57) ABSTRACT

An integrated circuit wafer and a manufacturing process for etching low K spin-on dielectrics such as HSQ in a High Density Plasma etch reactor utilizes roof and wall temperature to improve across-the-wafer uniformity, and a mixture of C4F8 and C2F6 etch gases to eliminate mid via etch stop and to maintain selectivity over underlying etch-stop layers.

16 Claims, 7 Drawing Sheets

LOW K DIELECTIC ETCH IN HIGH DENSITY PLASMA ETCHER

This application is a continuation-in-part of U.S. patent application Ser. No. 08/864,868 filed May 12, 1997 abandoned.

FIELD OF THE INVENTION

This invention relates to processes for integrated circuit manufacturing, and in particular to processes for plasma etching of low dielectric constant dielectric layers and wafers made by the process.

BACKGROUND OF THE INVENTION

Integrated circuits are becoming ever smaller, faster, and cheaper to produce. Accordingly, device geometries and minimum feature sizes are shrinking, and are currently commercially available down to 0.25 microns. In this size regime, the resistance and capacitance of interconnect lines providing electrical connection between devices plays an increasingly large role in determining speed and performance of the integrated circuit. As a result, in integrated circuit research and development, increasing attention has focused on reducing the resistance and capacitance of interconnect lines.

The distributed capacitance of a metal line running over or through a dielectric layer is proportional to the dielectric constant of the dielectric. Therefore, utilizing dielectrics having a low dielectric constant in integrated circuit processes, as the interlevel dielectric in multilevel metallization structures by way of example, is one important method of increasing speed and improving performance. One such dielectric with a low dielectric constant is a spin-on material known as HSQ, Hydrogen Silsesquioxane, which is utilized as a planarizing bottom layer in an interlevel dielectric stack, as illustrated in FIG. 1a. In this capacity, a contact or via etch must be performed through the HSQ and any other dielectric layers in the stack to provide an aperture for depositing a low resistance connection between metal layers. This contact or via etch process must be highly anisotropic in order to etch deep but narrow vias or contacts i.e., high aspect ratio vias or contacts. It must also have excellent selectivity with respect to the stopping material, which for most current applications is Ti or TiN, but may be Si, silicon nitride, or metals such as Al, Cu, or Ta, depending on the details of the process. Selectivity is required in order to allow overetch, so that the deepest contact/via is etched through without destroying the region beneath the shallowest contact/via. If the wafer surface is not exactly planar, there will always be contacts/vias of somewhat differing depths.

Standard contact/via etch processes have been developed having the requisite selectivity and anisotropy for interlevel dielectrics comprising oxides such as TEOS (tetraethylorthosilicate). One known contact/via dry etch method is performed in a high density plasma (HDP). Specialized etch machines have been developed for HDP etch such as the Applied Materials Centura 5300 or the Lam 9100. These high ion density machines operate in a lower pressure regime than standard plasma etch machines. The lowered pressures result in a more anisotropic etch, due to decreased ion collisions and scattering. The generally used etch gas for oxide etch comprises $C_2F_6$. The process selectivity of oxide to an underlying etch stop layer is generally achieved by allowing the formation of polymer, which is deposited in the contact/via during oxide etch but reacts away faster than it deposits. When the underlying layer is reached, the polymer deposits on the surface of non-oxygen containing layer faster than it volatilizes and causes etch stop.

However, when HSQ has been previously etched using $C_2F_6$ chemistry in an HDP reactor for a large wafer, however, etching would stop in some vias before reaching the etch stop layer and this would prevent effective HSQ etch, particularly when the HSQ layer is below a TEOS layer. Additionally, substantial etch non-uniformity has occurred from the center to the edge of the wafer. This has resulted in problems with "punch-through" of the etch stop layer, i.e., etching completely through the etch stop, on portions of the wafer. One factor believed to contribute to these effects is that the HSQ contains hydrogen and contains less oxygen than silicon dioxide. This is believed to promote increased polymer formation and deposition during HSQ etch as compared to $SiO_2$ etch. Attempts by several research groups to solve these problems and thereby realize a useful TEOS/HSQ etch in an HDP reactor have until now been largely unsuccessful.

SUMMARY OF THE INVENTION

It is therefore an object of this invention to provide an improved wafer for integrated circuits and a manufacturing process in a high-density plasma reactor which can be utilized to etch high aspect ratio contacts or vias through dielectrics where the dielectric includes HSQ.

Another object of this invention is to provide a manufacturing process for etching HSQ in a high-density plasma reactor which does not evidence an etch-stop effect at a dielectric interface during HSQ etch.

Another object of this invention is to provide a manufacturing process for etching HSQ in a high-density plasma reactor which has high anisotropy.

Another object of this invention is to provide a manufacturing process for etching HSQ in a high-density plasma reactor which has high selectivity over underlying layers.

Another object of this invention is to provide a wafer and a manufacturing process therefor for etching HSQ in a high-density plasma reactor which has improved across-the-wafer uniformity.

DETAILED DESCRIPTION OF THE INVENTION

Figure 1A:
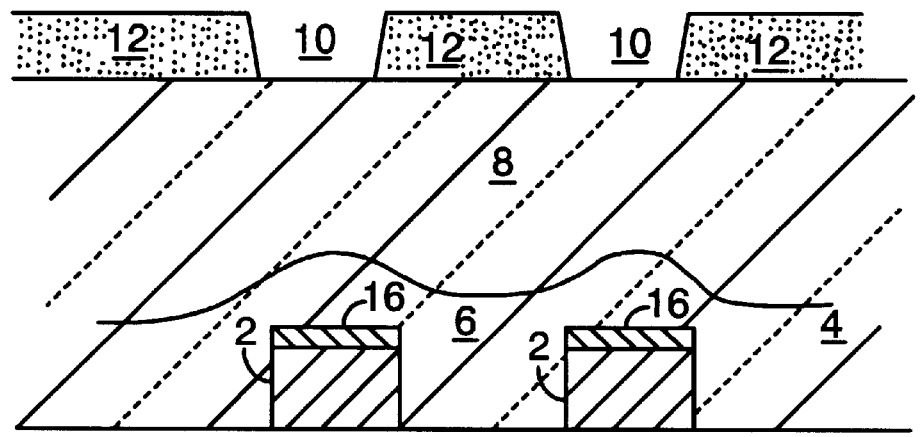
FIG. 1a shows a cross section of a multi-level metallization structure before contact/via etch, showing use of a low K spin-on layer in a dielectric stack.
Figure 1B:
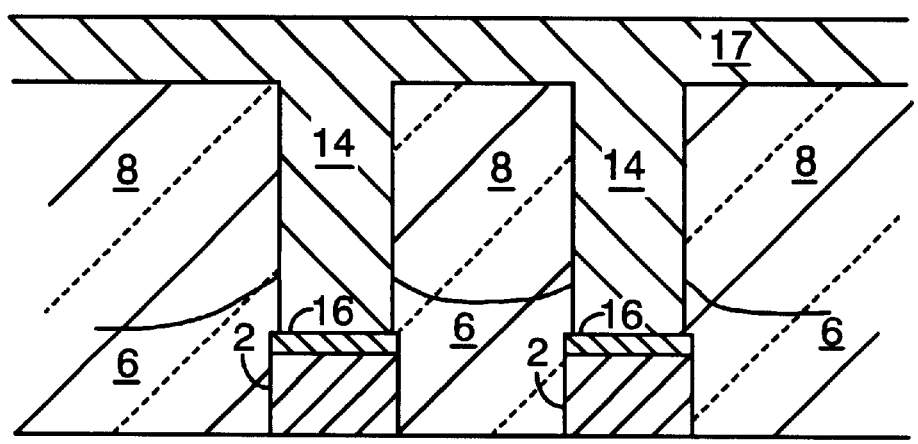
FIG. 1b shows the structure of FIG. 1a after contact/via etch.

FIGS. 1a and 1b illustrate the use of a low-K spin-on dielectric such as HSQ in a multi-level metallization structure on silicon wafer 1 with patterned active regions therein. FIG. 1a shows the structure before contact/via etch. First layer metal lines 2 with critical dimension of approx. 0.35 microns or less are electrically isolated from one another, and from the next layer of metal, by a dielectric layer 4. Dielectric layer 4 which may be approx. 0.5 to 2 microns in thickness is comprised of a spin-on layer 6, HSQ by way of example, and by deposited oxide layer 8, PETEOS (Plasma Enhanced TEOS) by way of example. In general, when HSQ is used it needs a cap layer such as TEOS above it since HSQ is hydrophilic. Via openings 10 are patterned into resist layer 12. FIG. 1b shows the structure after contact/via etch is performed. High-aspect ratio vias 14 require high anisotropy of the etch. Typical via dimensions are approx. 0.25–0.4 micron diameter, with depths ranging from 0.5 to 2.0 microns, depending on the range of dielectric layer thickness across wafer 1. Etch stop layer 16 is generally an anti-reflective coating (ARC) such as Ti or TiN, but it may be a metal such as Al, Al alloy, Cu, Ta, or it may be silicon or silicon nitride. Good etch selectivity for dielectric over all of these materials is important to achieving a broadly applicable HSQ etch, because of the differing via depths. In the best mode, a TiN ARC layer 56, FIG. 5a, with thickness of approximately 1100 A is used as the etch stop. The required etch selectivity of dielectric over the etch stop is calculated by the amount of overetch required and the thickness of the etch stop layer. In this case, since via depths range between 0.5 and 2.0 microns across the wafer, the shallowest, i.e. 0.5 micron vias will be etched down to the etch stop layer when 1.5 microns of dielectric remains to be etched for the deepest, i.e., 2.0 micron vias. (The assumption is made here that the etch rates of all the dielectrics in the stack are substantially equal). Accordingly, at least a portion of the TiN etch stop layer must remain across the entire wafer after overetch of 1.5 microns of dielectric in order to function as an effective etch stop. In order to have at least 100 Angstroms (i.e., 0.01 microns) of TiN remaining of the 1100 thick TiN ARC etch stop layer following overetch of 1.5 microns dielectric, the selectivity of HSQ and the remaining dielectric layer over TiN must be a minimum of 15:1.

After contact/via etch, second level metal 17 is deposited into the vias 14 to form electrical interconnection to the next metal layer.

Figure 2:
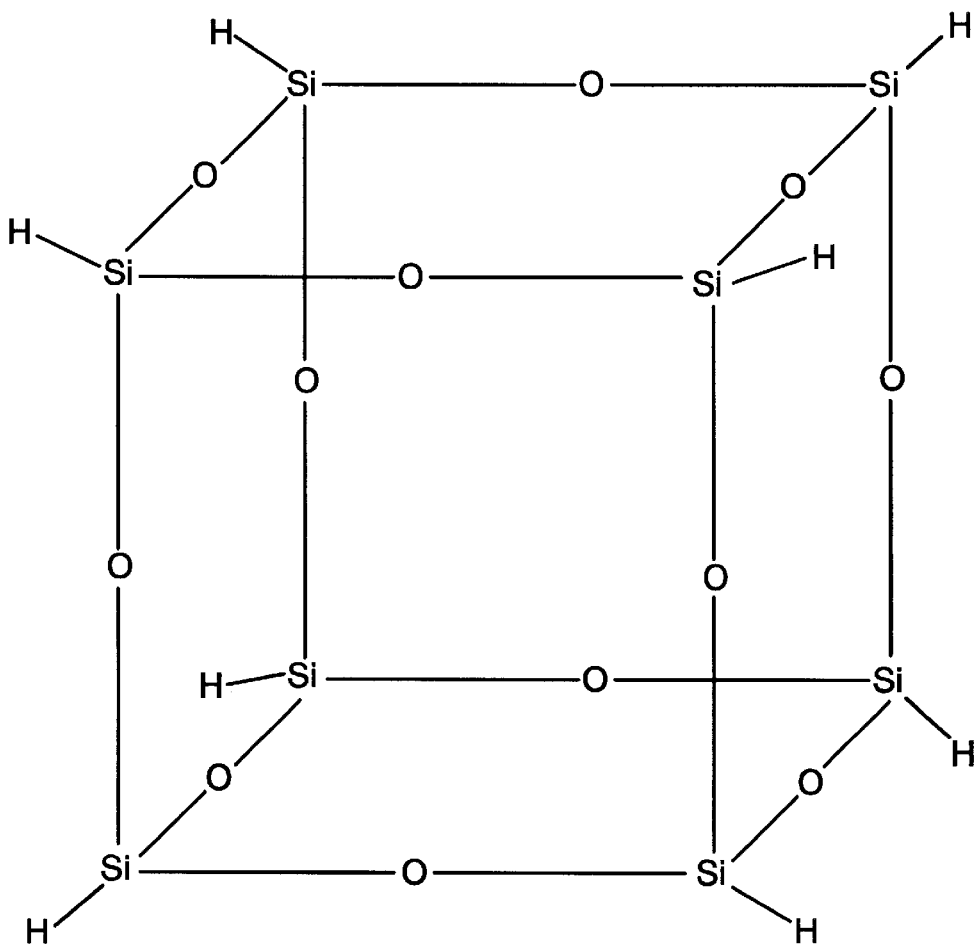
FIG. 2 shows the molecular structure of HSQ.

FIG. 2 illustrates the molecular structure of HSQ. The particular HSQ material used for the inventive process development is sold by Dow Corning under the trade name Flowable Oxide (FOx). Its chemical composition is (HSiO3/2)n.

Figure 3:
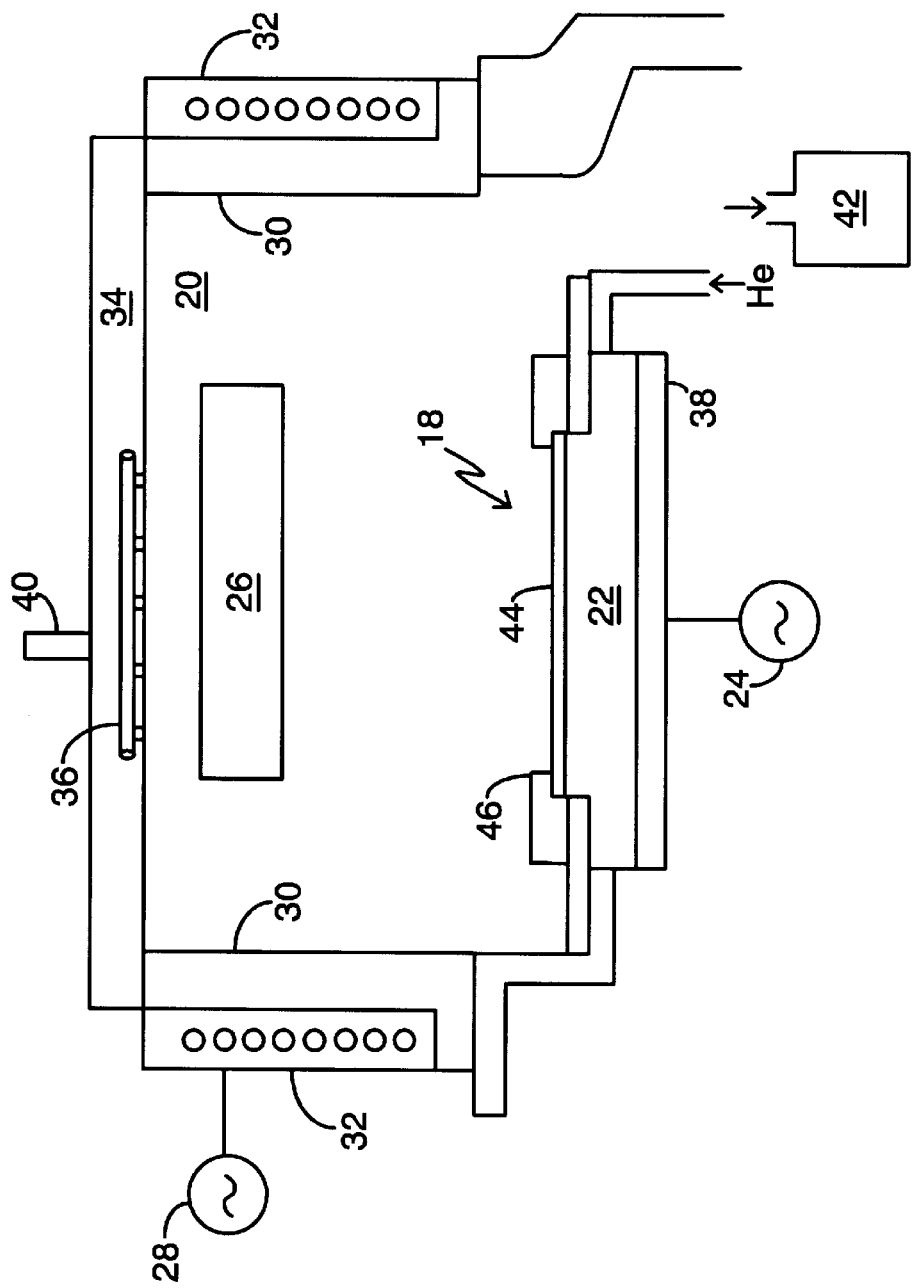
FIG. 3 shows a schematic diagram of a high-density plasma etch reactor.

FIG. 3 is a schematic diagram of the Applied Materials Centura 5300 HDP etch reactor, which was used to develop the inventive process. Wafer 18 is mounted in etch reactor 20 on electrostatic chuck 22. RF power supply 24 provides wafer bias. High density plasma 26 is generated by source inductive RF power supply 28. Walls 30 are temperature controlled by heated antenna assembly 32. Roof 34 is temperature controlled by top heater 36 having a hot fluid (ethylene glycol) pumped therethrough. Wafer temperature is controlled by backside cooler or chiller 38, with He flow between cooled chuck 22 and wafer 18. Reactor gases are introduced into the reactor via gas inlets 40. Vacuum pump 42 controls reactor pressure.

The HDP machine operates at an elevated plasma ion density (approx. 1012 cm–3) in the 1–5 milliTorr pressure range while maintaining a high etch rate. Etch anisotropy is improved over other types of plasma reactors. An additional feature of the HDP machine is the capability of controlling temperatures of roof 34 and wall 30, and thereby modifying polymer deposition on wafer 18. For a standard prior art contact/via etch of TEOS using C2F6 etch chemistry, walls 30 and roof 34 are maintained at a high temperature (approx. 290 C.) while wafer 18 is cooled by chiller 38 at approx. –10 to +10 C. Most of the polymer formed is therefore deposited on the relatively cool wafer. The polymer formation is a critical factor in providing a high selectivity of the dielectric etch rate over the etch rate of the etch stop layer. During dielectric etch, oxygen from the SiO2 reacts with carbon from the C2F6 etch gas, and polymer formed and deposited at the exposed SiO2 areas is volatilized. When the non-oxygen containing stopping layer, Ti or TiN by way of example, is reached, polymer deposition occurs and "backfills" the etched region, causing etch stop.

Polymer deposition is not uniform across the wafer. The wafer center 44, being farthest from the radiant heat source of walls 30, has the coolest temperature and thereby the greatest amount of polymer deposition. This effect is illustrated in Table 1, showing resist loss across a wafer during prior art standard contact/via etch.

TABLE 1

Resist loss uniformity using standard contact/via etch.

| Position on Wafer | Resist loss (Angstroms) |
| --- | --- |
| Left edge | 5866 |
| Center | 1664 |
| Right edge | 5390 |

Figure 4A:
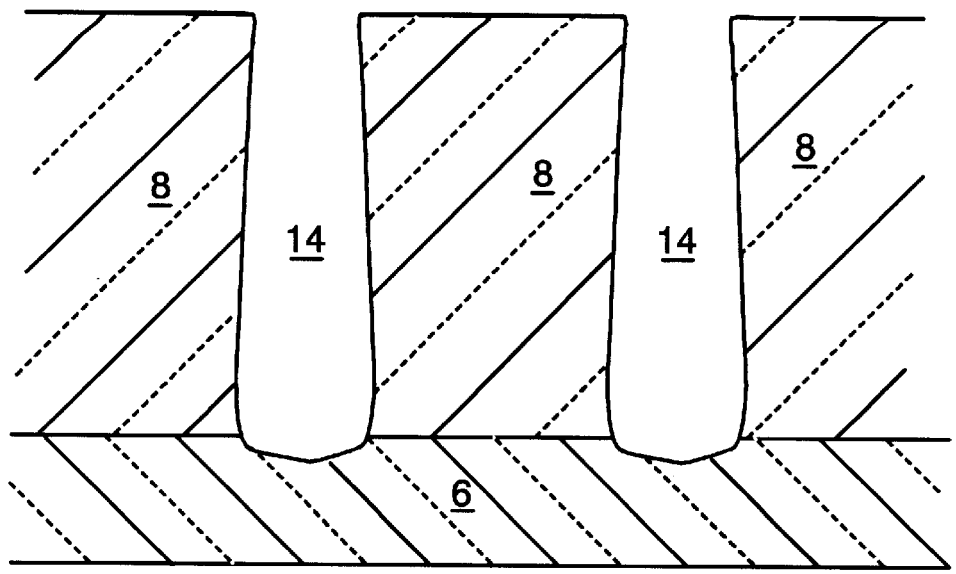
FIG. 4a is a proportional schematic of an actual SEM photograph of HSQ layer etched by the standard $C_2F_6$ contact/via etch process in the wafer edge region of an 8 inch wafer.
Figure 4B:
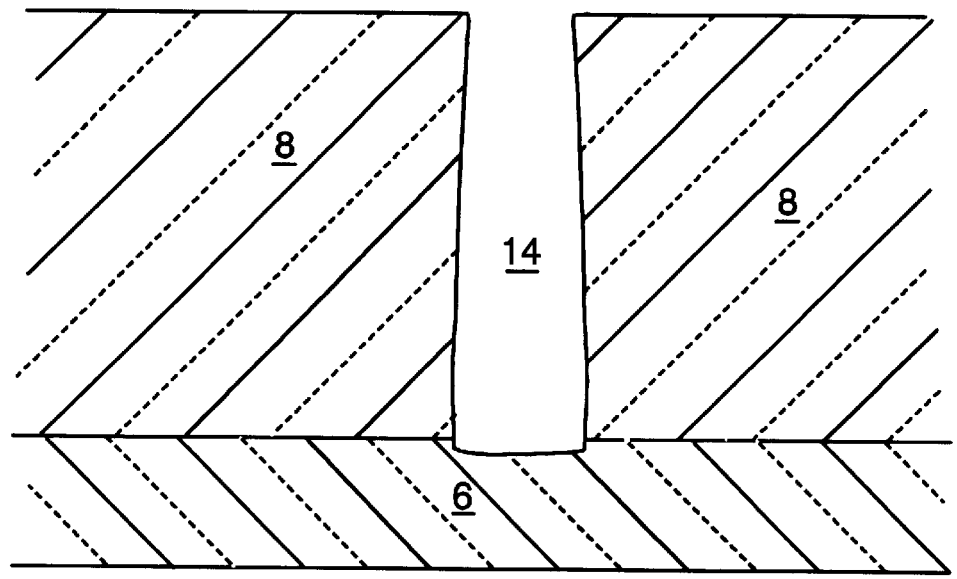
FIG. 4b is a proportional schematic of an actual SEM photograph of HSQ layer etched by the standard $C_2F_6$ contact/via etch process in the wafer center region of an 8 inch wafer.

Resist loss during etch is inversely proportional to the amount of polymer deposited, so the Table qualitatively demonstrates the increased polymer deposition at the wafer center. This level of non-uniformity of polymer does not adversely affect the standard TEOS etch, since due to the high oxygen content of the TEOS, a wide process window of polymer deposition amount still results in effective TEOS etch. However, when etching HSQ, the hydrogen reacts with the fluorine in the etch gas, releasing additional free carbon and resulting in greater polymer formation at the HSQ regions, which causes the etch to stop before completely etching through the HSQ, particularly at the wafer center 44. Since HSQ is less effective than SiO2 at preventing and reacting with deposited polymer, there is a smaller process window of polymer amount which will prevent etch-stop during the HSQ etch and still maintain the etch stop at the underlying layer. Prior art attempts to etch HSQ have not succeeded in placing both the wafer center 44 and the wafer edge 46 within this process window due to the degree of polymer deposition non-uniformity, particularly when the dielectric structure comprises a layer of HSQ under a layer of TEOS. FIG. 4 shows HSQ etch using the aforementioned prior art standard contact/via etch with C2F6 chemistry, and showing etch stop of the HSQ at the wafer edge 46 (FIG. 4a) and wafer center 44 (FIG. 4b).

It was experimentally determined that the polymer deposition and etch-stop during HSQ etch is pronounced at the interface between the HSQ and an overlayer of TEOS. The etch stop enhancement is also seen near the HSQ/underlying TiN layer interface. A likely explanation is that there exists a non-uniform hydrogen concentration in the HSQ, with hydrogen enrichment near the top and bottom of the HSQ layer.

The inventive process improves via etch uniformity across the wafer. This process provides a wafer having both edge and center vias falling within the process window yielding vias with acceptable profile and etch stop characteristics. The improved process lowered the roof temperature from approx. 290 C. to approx. 220–230 C. and lowered the wall temperature to approx. 200 C. Since the radiant heat source near the wafer edges is now cooler, the temperature variation across the wafer is decreased and therefore the uniformity of the polymer deposition rate improves. However, the lowered roof and wall temperatures also resulted in lower total polymer deposition on the wafer, which is compensated for in the inventive process by providing additional C4F8 to the etch gas. The carbon-rich C4F8 provides enhanced polymer formation which is necessary to avoid punch-through of the Ti or TiN during overetch. With the improved uniformity of polymer deposition, both the wafer edge and center fall within the acceptable process window when the C4F8 pressure is properly adjusted. The improved uniformity of polymer deposition with the lower roof and wall temperature and using C2F6/C4F8 mixture is illustrated in Table 2. Table 2 shows resist loss during contact/via etch for the inventive process compared with the standard contact/via etch process as shown in Table 1.

TABLE 2

Resist Loss Uniformity using standard vs inventive contact/via etch

| Position on wafer | Resist Loss in Angstroms (standard etch/inventive etch) |
| --- | --- |
| Left edge | 5866/3571 |
| Center | 1664/1418 |
| Right edge | 5320/2737 |

From Table 2, it can be seen that a "Resist Loss Ratio" can be calculated which compares the resist loss on the wafer left edge to the resist loss at the wafer center. For the standard (i.e., prior art) etch, this resist loss ratio, RL1, equals 5866/1664=3.525. For the preferred embodiment of our invention, the resist loss ratio, RL2, equals 3751/1418= 2.518. The percentage improvement in the resist loss ratio for the inventive etch $$\frac{RL1 - RL2}{RL2}$$

is approximately equal to 40%. This is an indicative measure of the improvement in the uniformity of the polymer deposition rate across the wafer as compared to the prior art.

Other chemical methods of enhancing polymer formation, such as addition of CH3F to the etch gases, have not been successful. This is thought to be due to difficulties in process control resulting from excess hydrogen in the etch gas.

The best mode etch process in the Applied Materials Centura 5300 HDP reactor comprises:

8 sccm C4F8

5 sccm C2F6

95 sccm Ar

2000 W Source power

1500 W Bias power 4 mTorr pressure, with throttle valve to vacuum pump open 100%

230 C. roof temperature

200 C. wall temperature

−10 C. chiller

15 Torr He (coolant between wafer and chuck)

Figure 5A:
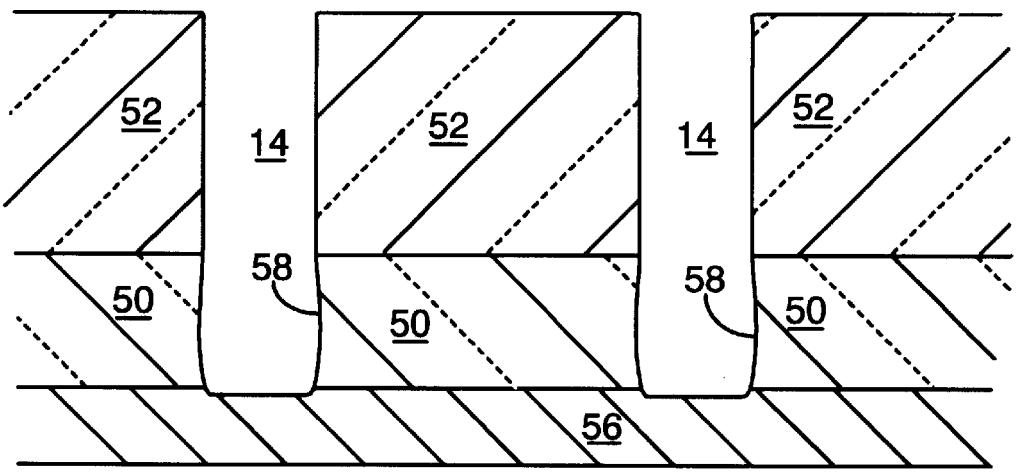
FIG. 5a is a proportional schematic of an actual SEM photograph of the best mode HSQ etch of vias in the wafer edge region of an 8 inch wafer.
Figure 5B:
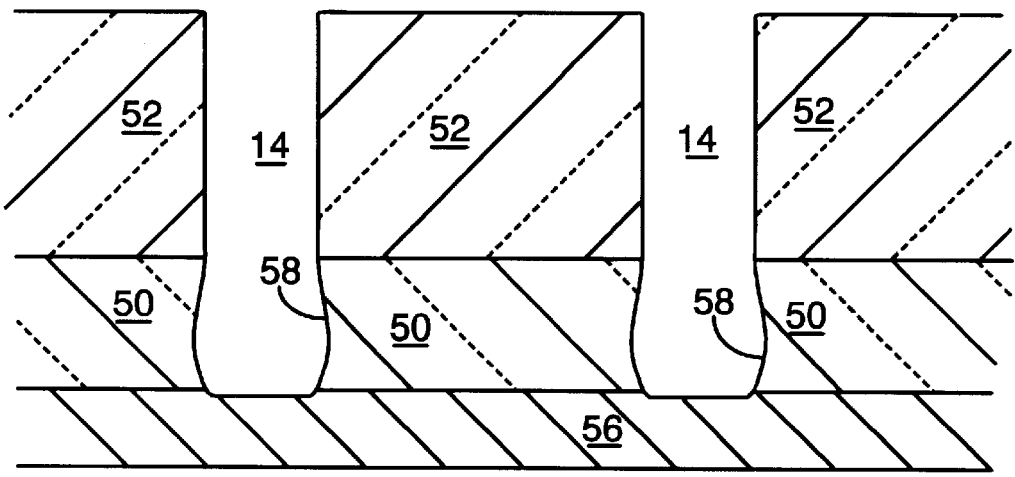
FIG. 5b is a proportional schematic of an actual SEM photograph of the best mode HSQ etch of vias in the wafer center region of an 8 inch wafer.
Figure 6A:
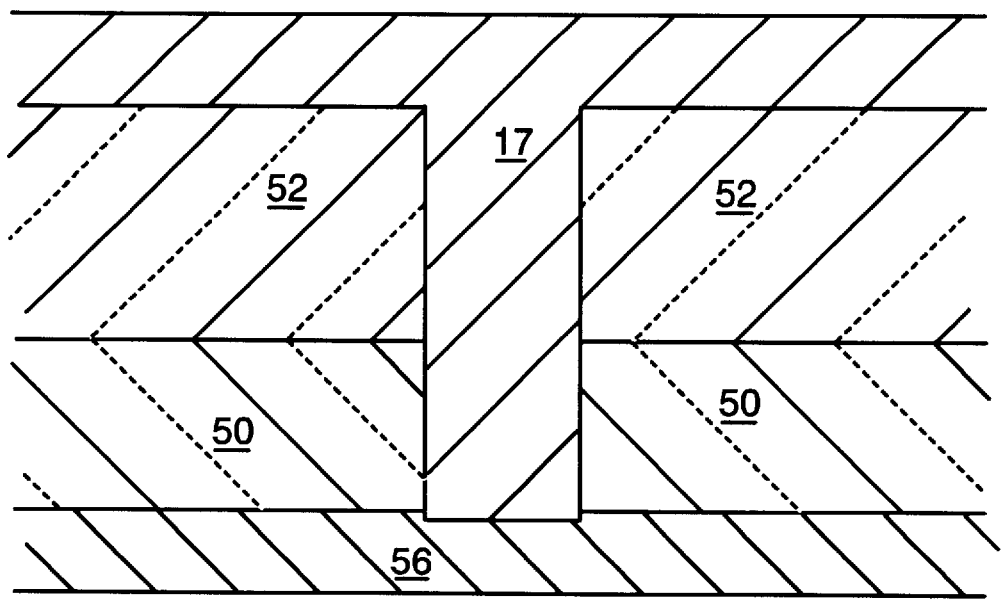
FIG. 6a is a proportional schematic of an actual SEM photograph of the best mode HSQ etch after tungsten via fill in the wafer edge region of an 8 inch wafer.
Figure 6B:
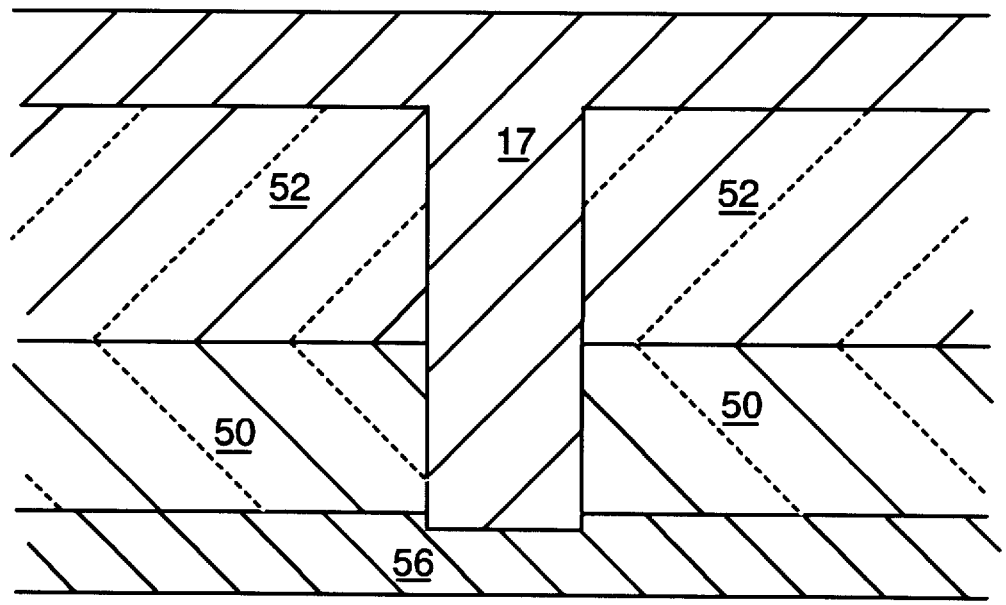
FIG. 6b is a proportional schematic of an actual SEM photograph of the best mode HSQ etch after tungsten via fill in the wafer center region of an 8 inch wafer.

FIGS. 5a and 5b show etched vias at wafer edge 46 (FIG. 5a) and wafer center 44 (FIG. 5b), using the best mode etch process, for a 0.25 micron metallization technology, wherein the via diameter is approximately 0.35–0.4 micron. Both TEOS layer 52 and HSQ layer 50 are completely etched, and TiN layer 56 provides an effective etch stop. The slight bowing of the via walls 58 seen in the HSQ layer has been determined to be an artifact of the SEM process, due to the physical characteristics of the spin-on HSQ. FIGS. 6a and 6b show similarly etched vias after tungsten via fill at the edge 46 (FIG. 6a) and center 44 (FIG. 6b), and the bowing is no longer seen. It is concluded that the bowing occurs when the etched wafer without filled vias is cleaved for the SEM photograph.

Marginally acceptable across-the wafer etch uniformity has been achieved with process parameters comprising:

10 sccm C4F8

5 sccm C2F6

95 sccm Ar

2200 W Source power

1500 W bias power 10 mTorr pressure

230 C. roof temperature

215 C. wall temperature

−10 C. chiller

15 Torr He

Figure 7A:
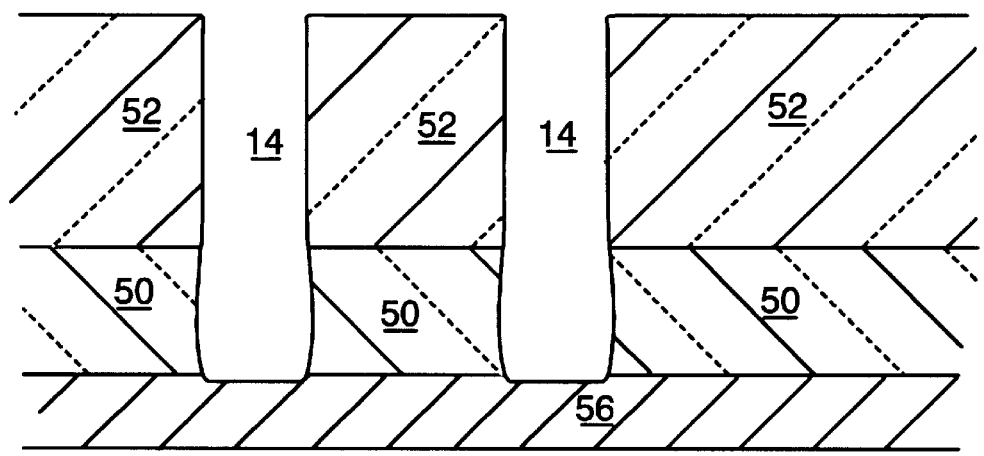
FIG. 7a is a proportional schematic of an actual SEM photograph of a non-optimized HSQ etch, showing no etch stop at the 8-inch wafer edge.
Figure 7B:
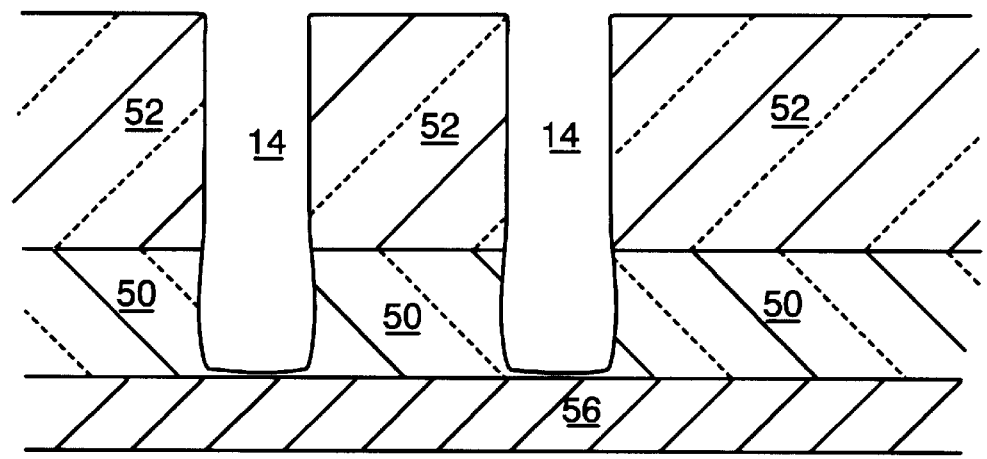
FIG. 7b is a proportional schematic of an actual SEM photograph of the HSQ etch of FIG. 7a, but showing etch stop at the wafer center.

Under these process conditions, slight evidence of the beginnings of HSQ etch stop at the wafer center 44 is observed, as shown in FIG. 7b, although no etch stop is seen at wafer edge 46, as shown in FIG. 7a.

Comparison with the best mode process parameters suggests quite narrow acceptable parameter ranges of:

5–10 sccm C4F8

5–9 sccm C2F6

50–200 sccm Ar

1800–2200 W Source power

1300–1700 W bias power

1–15 mTorr pressure

200–240 C. roof temperature

200–220 C. wall temperature

−20–0 C. chiller

10–15 TorrHe

Although selectivity of HSQ to underlying non-oxygen containing layers such as nitride or metal will vary slightly from the selectivity to Ti or TiN, due to the variation of the underlying layer etch rate by the C4F8/C2F6 etch gas during the brief period before polymer backfill shuts down the etch, the mechanism is expected to be similar for the various underlayers. Slight tuning of etch parameters might be needed to optimize selectivity.

By utilizing the inventive process for etching the low-K dielectric HSQ in an HDP reactor, contacts/vias with high aspect ratio and geometries of 0.35–0.4 microns and below can be effectively etched, across the entire 8 inch wafer diameter, through the low-dielectric constant dielectric material to the etch stop layer, and metal line capacitances can be reduced, improving ultimate device frequency. The inventive etch process can also be employed for other applications of the HSQ in the process, such as the Damascene process.

Whereas the process as described above utilizes the Applied Materials Centura 5300 etch system to etch HSQ over Ti or TiN layers, it is not limited to these exact embodiments. Other similarly designed HDP reactors such as the Lam 9100 may be utilized with minimal process parameter tuning. Other non-oxygen containing etch stop underlayers may be used, again with minimal process parameter tuning. Additionally, other dielectrics with similar chemical composition to HSQ such as Spin-On Glass (SOG) are expected to behave similarly. The inventive process is effectively utilized to etch silicon dioxide materials such as TEOS, as well as other dielectrics comprising silicon dioxide. These may include porous silica used as low-k dielectric, which would be utilized in conjunction with a non-porous cap layer comprising TEOS or the like. The scope of the invention should be construed in view of the claims. With this in mind,

We claim:

1. A process for manufacturing an integrated circuit wafer comprising:
   a) providing a silicon wafer with an interconnection metallization pattern thereon having an etch stop layer thereon, said wafer having a diameter of at least 8 inches;
   b) overlaying said metallization pattern with low K HSQ dielectric layer;
   c) overlaying said low K HSQ dielectric with a cap dielectric layer;
   d) said low K HSQ dielectric layer and said cap dielectric layer together comprising an interlevel dielectric layer;
   e) overlaying said cap dielectric layer with a patterned resist layer defining vias;
   f) after steps a) through e), installing said silicon wafer in an HDP reactor having adjustable parameters including roof temperature, wall temperature, RF inductive source power, RF bias power, He backside wafer cooler, and means for establishing low pressure, high density plasma;
   g) etching said silicon wafer in said HDP reactor and setting said adjustable parameters to etch completely through said cap layer and said low K HSQ dielectric layer using simultaneously a plurality of fluorocarbon etching gases, a portion of said patterned resist layer being removed during said etch with a resist loss ratio; and
   h) continuing said etching step until said vias are etched through said interlevel dielectric layer and stopping across said entire silicon wafer before etching completely through any portion of said etch stop layer, thereby achieving across-the-wafer uniformity, said resist loss ratio having a value reduced by at least approximately 40% as compared to the prior art.

2. The process of claim 1 wherein:
   said etch stop layer has a thickness not greater than 1100 Angstroms;
   said interlevel dielectric layer thickness across the entire said silicon wafer is in the range between 0.5 and 2.0 microns;
   said metallization pattern having a critical dimension of 0.35 microns or smaller; and
   said defined vias having a diameter less than 0.5 microns.

3. The process of claim 1 wherein said fluorocarbon etching gases comprise C2F6 and C4F8.

4. The process of claim 3 wherein:
   said etch stop layer has a thickness not greater than 1100 Angstroms;
   said interlevel dielectric layer thickness across the entire said silicon wafer is in the range between 0.5 and 2.0 microns;
   said metallization pattern having a critical dimension of 0.35 microns or smaller; and
   said defined vias having a diameter less than 0.5 microns, and
   said resist loss ratio is at least approximately 40% less than the prior art resist loss ratio.

5. The process of claim 3 wherein said etch stop layer is selected from the group consisting of Ti, TiN, silicon, silicon nitride, aluminum, aluminum alloy, copper, copper alloy, tantalum, and tantalum alloy.

6. The process of claim 5 wherein said etch stop layer is selected from the group consisting of Ti, and TiN.

7. The process of claim 6 wherein:
   said etch stop layer has a thickness not greater than 1100 Angstroms;
   said interlevel dielectric layer thickness across the entire said silicon wafer is in the range between 0.5 and 2.0 microns;
   said metallization pattern having a critical dimension of 0.35 microns or smaller; and
   said defined vias having a diameter less than 0.5 microns, and
   said resist loss ratio is at least approximately 40% less than the prior art resist loss ratio.

8. The process of claim 6 further comprising the steps of:
   adjusting said roof temperature to be within the range 200–240° C.;
   adjusting said wall temperature to be within the range 200–220° C.;
   adjusting said RF source power to be within the range 1800–2200 W;
   adjusting said RF bias power to be within the range 1300–1700 W;
   adjusting said backside wafer cooler temperature to be within the range −20–0° C.;
   adjusting said low pressure to be within the range 1–15 mTorr;
   flowing C4F8 into said HDP reactor at a C4F8 flow rate of 5–10 sccm;
   flowing C2F6 into said HDP reactor at a C2F6 flow rate of 5–9 sccm;
   flowing 50–200 sccm Ar gas into said HDP reactor.

9. The process of claim 8 wherein:
   said etch stop layer has a thickness not greater than 1100 Angstroms;
   said interlevel dielectric layer thickness across the entire said silicon wafer is in the range between 0.5 and 2.0 microns;
   said metallization pattern having a critical dimension of 0.35 microns or smaller; and said defined vias having a diameter less than 0.5 microns, and said resist loss ratio is at least approximately 40% less than the prior art resist loss ratio.

10. The process of claim 9, wherein said HDP etch reactor is an Applied Materials Centura 5300 reactor.

11. The process of claim 10 wherein:
said roof temperature is 230° C.;
said wall temperature is 200° C.;
said RF source power is 2000 W;
said RF bias power is 1500 W;
said backside wafer cooler temperature is −10° C.;
said low pressure is 4 mTorr;
said C4F8 flow rate is 8 sccm; and
said C2F6 flow rate is 5 sccm.

12. The process of claim 11 wherein:
said etch stop layer has a thickness not greater than 1100 Angstroms;
said interlevel dielectric layer thickness across the entire said silicon wafer is in the range between 0.5 and 2.0 microns;
said metallization pattern having a critical dimension of 0.35 microns or smaller; and
said defined vias having a diameter less than 0.5 microns, and
said resist loss ratio is at least approximately 40% less than the prior art resist loss ratio.

13. An integrated circuit intermediate product made by the process of:
a) providing a silicon wafer having a diameter of at least 8 inches with an interconnection metallization pattern thereon having an etch stop layer thereon, said etch stop layer having a thickness not substantially greater than 1100 Angstroms, said metaliization pattern having a critical dimension of 0.35 microns or smaller;
b) overlaying said metallization pattern with low K HSQ dielectric layer;
c) overlaying said low K HSQ dielectric with a cap dielectric layer;
d) said low K HSQ dielectric layer and said cap dielectric layer together comprising an interlevel dielectric layer, said interlevel dielectric layer having a thickness across the entire said silicon wafer in the range between 0.5 and 2.0 microns;
e) overlaying said cap dielectric layer with a patterned resist layer defining vias, said defined vias having a diameter less than 0.5 microns;
f) after steps a) through e), installing said silicon wafer in an HDP reactor having adjustable parameters including roof temperature, wall temperature, RF inductive source power, RF bias power, He backside wafer cooler, and means for establishing low pressure, high density plasma therein using fluorocarbon etching gases; and g) etching said silicon wafer in said HDP reactor, a portion of said patterned resist layer being removed during said etch with a resist loss ratio; and setting said adjustable parameters to etch completely through said cap layer and said low K HSQ dielectric layer while selectively stopping across said entire silicon wafer before etching completely through any portion of said etch stop layer, thereby achieving across-the-wafer uniformity, said resist loss ratio having a value reduced by at least approximately 40% as compared to the prior art.

14. The integrated circuit intermediate product of claim 13, wherein:
said fluorocarbon etching gases comprise C2F6 and C4F8.

15. The integrated circuit intermediate product of claim 14, wherein said etch stop layer is selected from the group consisting of Ti and TiN, and wherein said process of making further comprises the steps of:
adjusting said roof temperature to be within the range 200–240° C.;
adjusting said wall temperature to be within the range 200–220° C.;
adjusting said RF source power to be within the range 1800–2200 W;
adjusting said RF bias power to be within the range 1300–1700 W;
adjusting said backside wafer cooler temperature to be within the range −20–0° C.;
adjusting said low pressure to be within the range 1–15 mTorr;
flowing C4F8 into said HDP reactor at a C4F8 flow rate of 5–10 sccm;
flowing C2F6 into said HDP reactor at a C2F6 flow rate of 5–9 sccm;
flowing 50–200 sccm Ar gas into said HDP reactor.

16. The integrated circuit intermediate product of claim 15, wherein:
said HDP etch reactor is an Applied Materials Centura 5300 reactor;
said roof temperature is 230° C.;
said wall temperature is 200° C.;
said RF source power is 2000 W;
said RF bias power is 1500 W;
said backside wafer cooler temperature is −10° C.;
said low pressure is 4 mTorr;
said C4F8 flow rate is 8 sccm; and
said C2F6 flow rate is 5 sccm.

* * * * *

UNITED STATES PATENT AND TRADEMARK OFFICE
CERTIFICATE OF CORRECTION

PATENT NO. : 6,670,265 B1
DATED : December 30, 2003
INVENTOR(S) : Wang et al.

It is certified that error appears in the above-identified patent and that said Letters Patent is hereby corrected as shown below:

<u>Title page, Item [54] and Column 1, line 1,</u>
Title, "DIELECTIC" should read -- DIELECTRIC --.

Signed and Sealed this

Twenty-seventh Day of April, 2004

JON W. DUDAS
*Acting Director of the United States Patent and Trademark Office*